United States Patent
Kikuchi et al.

(10) Patent No.: US 6,384,590 B1
(45) Date of Patent: May 7, 2002

(54) LIGHT RECEIVING CIRCUIT FOR USE IN ELECTRO-OPTIC SAMPLING OSCILLOSCOPE

(75) Inventors: Jun Kikuchi; Nobuaki Takeuchi; Yoshiki Yanagisawa; Nobukazu Banjo; Yoshio Endou; Mitsuru Shinagawa; Tadao Nagatsuma; Junzo Yamada, all of Tokyo (JP)

(73) Assignees: Ando Electric Co., Ltd.; Nippon Telegraph and Telephone Corporation, both of Tokyo (JP)

( * ) Notice: Subject to any disclaimer, the term of this patent is extended or adjusted under 35 U.S.C. 154(b) by 0 days.

(21) Appl. No.: 09/437,155

(22) Filed: Nov. 10, 1999

(30) Foreign Application Priority Data

Nov. 11, 1998 (JP) .......................................... 10-321131

(51) Int. Cl.[7] ................................................. G06G 7/19
(52) U.S. Cl. ..................... 324/76.36; 324/647; 250/205; 250/214 A
(58) Field of Search .............................. 324/76.36, 647; 250/205, 214 A

(56) References Cited

U.S. PATENT DOCUMENTS

| | | | | |
|---|---|---|---|---|
| 4,868,402 A | * | 9/1989 | Triponez | 250/561 |
| 4,899,212 A | * | 2/1990 | Kaneko et al. | 358/29 |
| 5,153,713 A | * | 10/1992 | Kyuma et al. | 358/29 |
| 5,233,462 A | * | 8/1993 | Wong | 359/330 |
| 5,448,393 A | * | 9/1995 | Lentine et al. | 359/193 |
| 5,483,368 A | * | 1/1996 | Ohshima | 359/124 |
| 5,805,558 A | * | 9/1998 | Kimura | 369/116 |
| 6,008,931 A | * | 12/1999 | Helmolt et al. | 359/326 |

FOREIGN PATENT DOCUMENTS

| | | | |
|---|---|---|---|
| DE | 2828167 | * | 1/1980 |
| JP | 61083912 | | 4/1986 |

* cited by examiner

Primary Examiner—Safet Metjahic
Assistant Examiner—Vincent Q. Nguyen
(74) Attorney, Agent, or Firm—Finnegan, Henderson, Farabow, Garrett, & Dunner LLP

(57) ABSTRACT

In a light receiving circuit for use in electro-optic sampling oscilloscope which receives first and second optical, photodiodes 51 and 52 are connected in series between a positive bias power supply 50P and a negative bias power supply 50N. The photodiodes 51 and 52 receive optical signals whose polarization state correspond to the voltage of a signal to be measured and convert the thus-received optical signals into electric signals. An amplifier 53 amplifies an electric current appearing in a point of connection P between the photodiodes 51 and 52. A current monitor 54 detects the electric signal converted by the photodiode 51, and a current monitor 57 detects the electric signal converted by the photodiode 52. The electric signal detected by the current monitor 54 is subjected to analog-to-digital conversion by an analog-to-digital converter 55, and the electric signal detected by the current monitor 57 is subjected to analog-to-digital conversion by an analog-to-digital converter 58. A control section formed from a subtraction circuit 60 controls a ratio of polarization between the optical signals such that the difference between the value of the current detected by the current monitor 54 and the value of the current detected by the current monitor 57 becomes smaller.

3 Claims, 3 Drawing Sheets

Prior Art

US 6,384,590 B1

LIGHT RECEIVING CIRCUIT FOR USE IN ELECTRO-OPTIC SAMPLING OSCILLOSCOPE

BACKGROUND OF THE INVENTION

1. Field of the Invention

The present invention relates to a light receiving circuit for use in an electro-optic sampling oscilloscope which receives an optical signal polarized so as to reflect a signal to be measured and which reproduces an electric signal according to the signal to be measured on the basis of the polarization state of the optical signal.

2. Description of the Related Art

An electro-optic sampling oscilloscope (hereinafter abbreviated as an "EOS oscilloscope") which optically samples a signal to be measured and reproduces the waveform of the signal has conventionally been used for observing the waveform of, for example, an internal signal of an integrated circuit.

In the EOS oscilloscope, an electro-optic crystal whose plane of polarization is changed by an electric field is connected to a portion where an internal signal to be measured (hereinafter abbreviated as a "target signal") appears, and the target signal is reproduced on the basis of the deflected state of light reflected by the electro-optic crystal. The EOS oscilloscope comprises an electro-optic probe equipped with a built-in optical system for acquiring an optical signal whose polarization state corresponds to the target signal, and a light-receiving circuit which receives the optical signal and reproduces an electric signal corresponding to the polarization state of the optical signal.

In contrast to a conventional sampling oscilloscope using an electric probe, the EOS oscilloscope has the following characteristics:

1) Since the EOS oscilloscope does not need a ground line at the time of measuring a signal, the signal can be readily measured.
2) A metal pin provided at the tip of the electro-optic probe is electrically insulated from circuitry of the oscilloscope, and hence the waveform of a target signal can be measured without distorting the state of the target signal.
3) The EOS oscilloscope utilizes an optical pulse signal, and hence the EOS oscilloscope can measure a wide frequency range extending up to giga hertz. Because of these merits, the EOS oscilloscope receives attention.

An exemplary configuration of an electro-optic probe used in the EOS oscilloscope will now be described by reference to FIG. 2. In the drawing, reference numeral 1 designates a probe head formed from an insulator, and a metal pin 1a to be brought into contact with an area where a target signal appears is fitted into the center of the probe head 1. Reference numeral 2 designates an electro-optic element (i.e., electro-optic crystal) whose plane of polarization is changed by an electric field. A reflection film 2a is provided on the side of the electro-optic element 2 facing the metal pin 1a and remains in contact with the metal pin 1a.

Reference numeral 4 designates a half-wave plate; 5 designates a quarter-wave plate; 6 and 8 designate polarization beam splitters; 7 designates a Faraday element; 9 designates a laser diode which emanates a laser beam in accordance with a pulse signal (control signal) output from the EOS oscilloscope main unit (not shown); and 10 designates a collimator lens which collimates a laser beam emitted from the laser diode 9 in a single direction. The electro-optic element 2, the half-wave plate 4, the quarter-wave plate 5, the polarization beam splitters 6 and 8, and the Faraday element 7 are disposed on the optical path of a laser beam A collimates by the collimator lens 10.

Reference numerals 11 designates a collective lens for collecting a laser beam separated by the polarization beam splitter 6; 13 designates a collective lens for collecting a laser beam separated by the polarization beam splitter 8; and 101 and 104 designate photodiodes constituting a light-receiving circuit to be described later. The photodiode 101 converts the laser beam collected by the collective lens 11 into an electric signal and outputs the electric signal to the EOS oscilloscope main unit, and the photodiode 104 converts the laser beam collected by the collective leans 13 into an electric signal and outputs the electric signal to the EOS oscilloscope main unit.

Reference numeral 15 designates a probe body; and 17 designates an isolator comprising the quarter-wave plate 5, the two polarization beam splitter 6 and 8, and the Faraday element 7. The isolator 17 permits transmission of the laser beam emitted from the laser diode 9 and separates orthogonal polarization component of the light reflected by the reflection film 2a.

The exemplary configuration of the conventional light-receiving circuit used in the EOS oscilloscope will be described by reference to FIG. 3. In the drawing, reference numeral 100 designates a bias power supply; 101 and 104 designate photodiodes; 102 and 105 designate resistors; 103 and 106 designate amplifiers; 107 designates a current monitor; 108 designates an analog-to-digital-converter; 109 designates a differential amplifier comprising resistors 109A to 109D and an operational amplifier 109E; 110 designates a resistor; and 111 designates an analog-to-digital converter.

In the light-receiving circuit, the photodiode 101 is biased by the bias power supply 100, to thereby produce an electric current. The electric current is amplified by the respective amplifiers 103 and 106, and a difference between the signals output from the amplifiers 103 and 106 is amplified by the differential amplifier 109, thus producing a target signal. The value of a signal output from the differential amplifier 109 is subjected to analog-to-digital conversion by the analog-to-digital converter 111. Electric currents produced by the photodiodes 101 and 104 are monitored by the current monitor 107, and the values of the currents are subjected to analog-to-digital conversion by the analog-to-digital converter 108.

The operation of the conventional light-receiving circuit will now be described.

The laser diode 10 shown in FIG. 2 is activated by a pulse signal (control signal) and emits the pulse-like laser beam A having a sampling frequency. The laser beam A is converted into collimated light by the collimator leans 9, and the thus-collimated light travels straight ahead through the polarization beam splitter 8, the Faraday element 7, and the polarization beam splitter 6 and enters the electro-optic element 2 by way of the quarter-wave plate 5 and the half-wave plate 4.

The laser beam that has entered the electro-optic element 2 is reflected by the reflection film 2a formed on the end face of the electro-optic element 2 facing the metal pin 1a. When the metal pin 1a is brought into contact to a point of measurement, the electric field corresponding to the voltage applied to the metal pin 1a is propagated to the electro-optic element 2, thus causing a phenomenon in which the double refractive indices of the electro-optic element 2 are changed by the Pockels effect. The polarized state of the light is changed when the laser beam emitted from the laser diode 9 propagates through the electro-optic element 2. As a result, the laser beam reflected by the end face of the electro-optic element 2 includes a polarization component corresponding to the voltage of the target signal.

The laser beam reflected by the end face of the electro-optic element 2 passes again through the half-wave plate 4 and the quarter-wave plate 5. A portion of the laser beam (a polarization component corresponding to the voltage of the target signal 9 is separated by the polarization beam splitter 6. The thus-separated beam is collected by the collective lens 11, and the thus-collected beam enters the photodiode 101 constituting the light-receiving circuit. The remaining laser beam that has transmitted through the polarization beam splitter 6 is separated by the polarization beam splitter 8, and the thus-separated laser beam is collected by the collective lens 13. The laser beam then enters the photodiode 104 shown in FIG. 3 and is converted into an electric signal.

The operation of the light-receiving circuit will now be described. When the plane of polarization of the electro-optic element 2 is changed in association with a change in the voltage of the target signal, there arises a difference between the signal output from the photodiode 101 and the signal output from the photodiode 104. Upon detection of the difference, the light-receiving circuit is operated so as to output a measurement signal corresponding to the target signal.

When the photodiode 101 of the light-receiving circuit receives the laser beam emitted from the polarization beam splitter, the photodiode 101 produces an electric current corresponding to the intensity of the laser beam, and a voltage corresponding to the electric current appears at one end of the resistor 102. The thus-appeared voltage is amplified by the amplifier 103. Similarly, a voltage corresponding to the electric current produced by the photodiode 104 appears at one end of the resistor 105, and the voltage is amplified by the amplifier 106. The differential amplifier 109 outputs a measurement signal corresponding to the difference between the signal output from the amplifier 103 and the signal output from the amplifier 106.

As mentioned above, in the conventional light-receiving circuit, the signal detected by the photodiode 101 is amplified by the amplifier 103, and the signal detected by the photodiode 104 is amplified by the amplifier 106. Subsequently, the difference between the signals is amplified by the differential amplifier 109, thus detecting only a measurement signal.

The electric current monitored by the current monitor 107 is subjected to analog-to-digital conversion by the analog-to-digital converter 108. The current is used for verification or calibration of operation of the photodiodes 101 and 104 together with the value of the measurement signal converted by the analog-to-digital converter 111. The plane of polarization of the laser beam that enters the electro-optic element 2 must be matched with the crystallographic axis of the electro-optic element 2. To this end, the plane of polarization is controlled by rotation of the half-wave plate 4 and the quarter-wave plate 5.

However, in the conventional light-receiving circuit, the signal detected by the photodiode 101 is amplified by the amplifier 103, and the signal detected by the photodiode 104 is amplified by the amplifier 106. If a sampling frequency is shortened as a result of an increase in a sampling rate, a difference in transient response characteristics between the amplifiers 103 and 106 becomes manifest. As a result, in-phase signal components of the photodiodes 101 and 104 appear in the form of an error of the measurement signal output from the differential amplifier 109, thus deteriorating the signal-to-noise ratio (S/N) of the waveform of the measurement signal.

SUMMARY OF THE INVENTION

The present invention has been conceived in view of the foregoing problem in the related art, and an object of the present invention is to provide a light-receiving circuit for use in an electro-optic sampling oscilloscope which prevents in-phase signal components of the photodiodes from appearing in the form of an error of a measurement signal, which would otherwise be caused when the sampling frequency becomes shorter as a result of an increase in a sampling rate, and can accurately convert a received optical signal into an electric signal.

According to one aspect of the present invention, there is provided a light-receiving circuit for use in an electro-optic sampling oscilloscope which receives first and second optical signals resulting from polarized separation of an optical signal whose polarized state reflects the voltage of a signal to be measured, and which produces an electric signal corresponding to the relative relationship between the intensity of the first optical signal and the intensity of the second optical signal, the circuit comprising:

first and second photo-electric conversion elements which are connected in series between a first bias power supply and a second bias power supply, receive the first and second optical signals, and convert the first and second optical signals into electric signals;

an amplifier which receives an electric signal appearing in a point of connection between the first and second photo-electric conversion elements and amplifies the electric signal; and a first detector for detecting the electric signal converted by the first photo-electric conversion element and a second detector for detecting the electric signal converted by the second photo-electric conversion element.

Preferably, the light-receiving circuit further comprises a control section for controlling the ratio of polarization between the optical signals such that the difference between the value detected by the first detector and the value detected by the second detector becomes smaller when the first and second photo-electric conversion elements receive the reference light.

Preferably, the light-receiving circuit further comprises a correction section for correcting the value of an output of the amplifier in accordance with the amount of variation in the sum of the value detected by the first detector and the value detected by the second detector.

DETAILED DESCRIPTION OF THE PREFERRED EMBODIMENTS

Now, a description will be given in more detail of preferred embodiments of the present invention with reference to the accompanying drawings.

A light-receiving circuit for use in an electro-optic sampling oscilloscope according to one embodiment of the present invention will be described hereinbelow by reference to the accompanying drawings.

Figure 2:
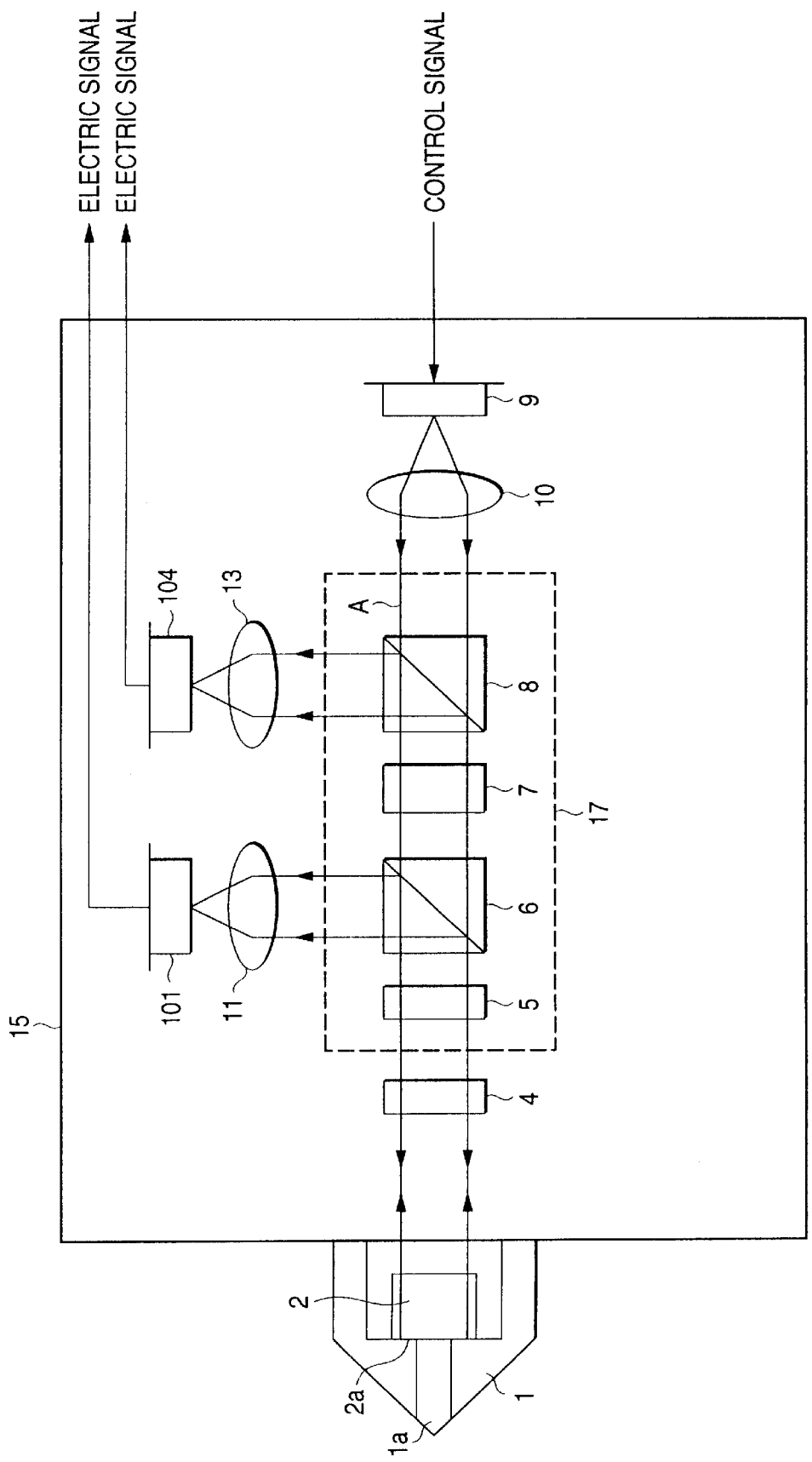
FIG. 2 is a schematic diagram showing an electro-optic probe used in an EOS oscilloscope.

The EOS oscilloscope comprising the light-receiving circuit of the present invention is equipped with an electro-optic probe shown in FIG. 2.

Figure 1:
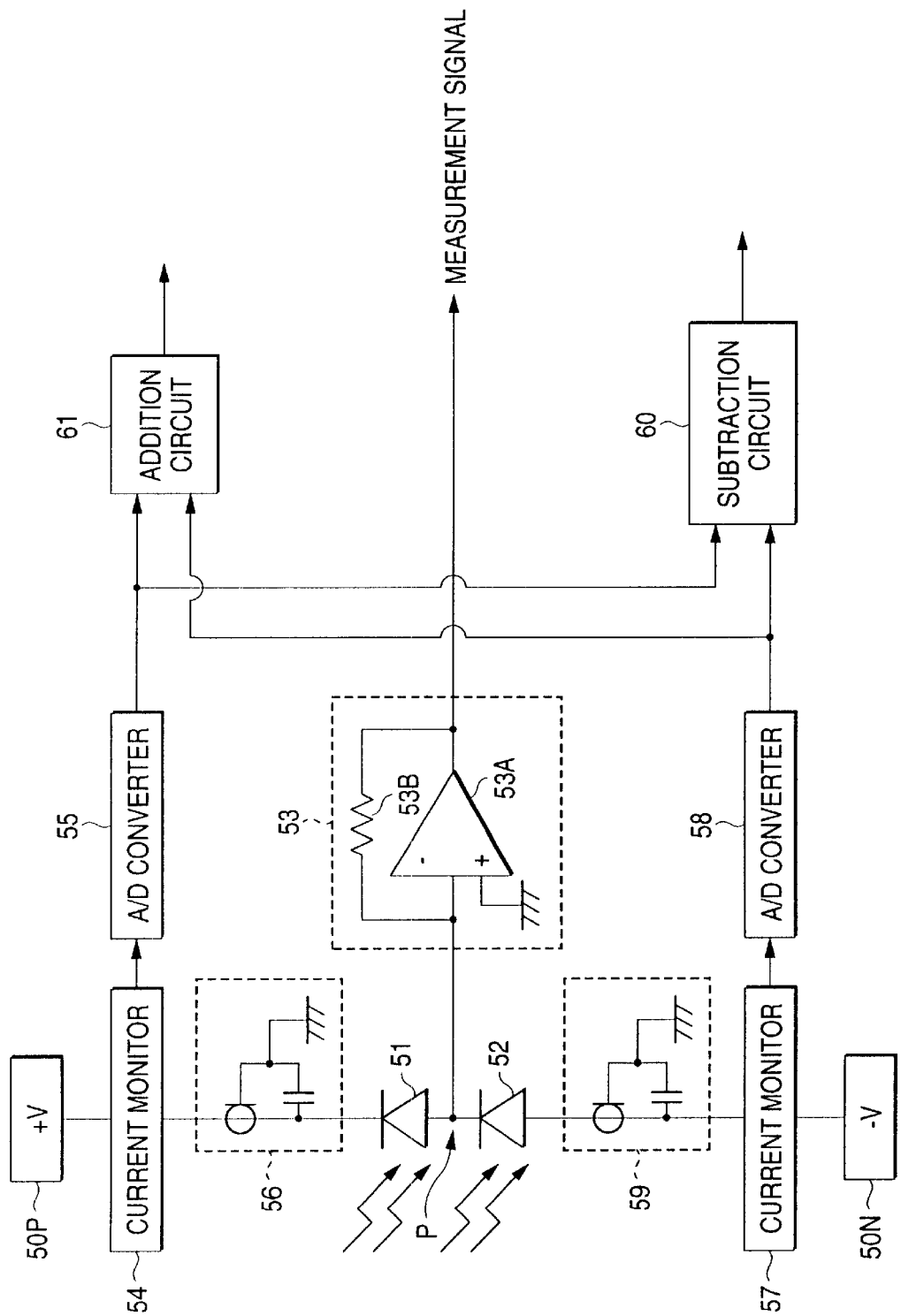
FIG. 1 is a schematic diagram showing an electro-optic sampling oscilloscope according to an embodiment of the present invention.

FIG. 1 shows the configuration of the light-receiving circuit according to the present embodiment. The photodiode 51 and 52 respectively correspond to the photodiodes 101 and 104 of the electro-optic probe as shown in FIG. 2. As shown in the drawing, the photodiode 51 (first photoelectric conversion element) and the photodiode 52 (second photo-electric conversion element) are connected in series as the photo-electric conversion elements between a positive bias power supply 50P (first power supply) and a negative bias power supply 5ON (second power supply), so that the direction in which the current flows through the photodiode 51 is matched with the direction in which the current flows through the photodiode 52. An input section of an amplifier 53 comprising an operation amplifier 53A and a feedback resistor 53B, is connected to a point of connection P between the photodiodes 51 and 52. The amplifier 53 is constituted as a transimpedance circuit and acts as a current-to-voltage conversion circuit.

Figure 3:
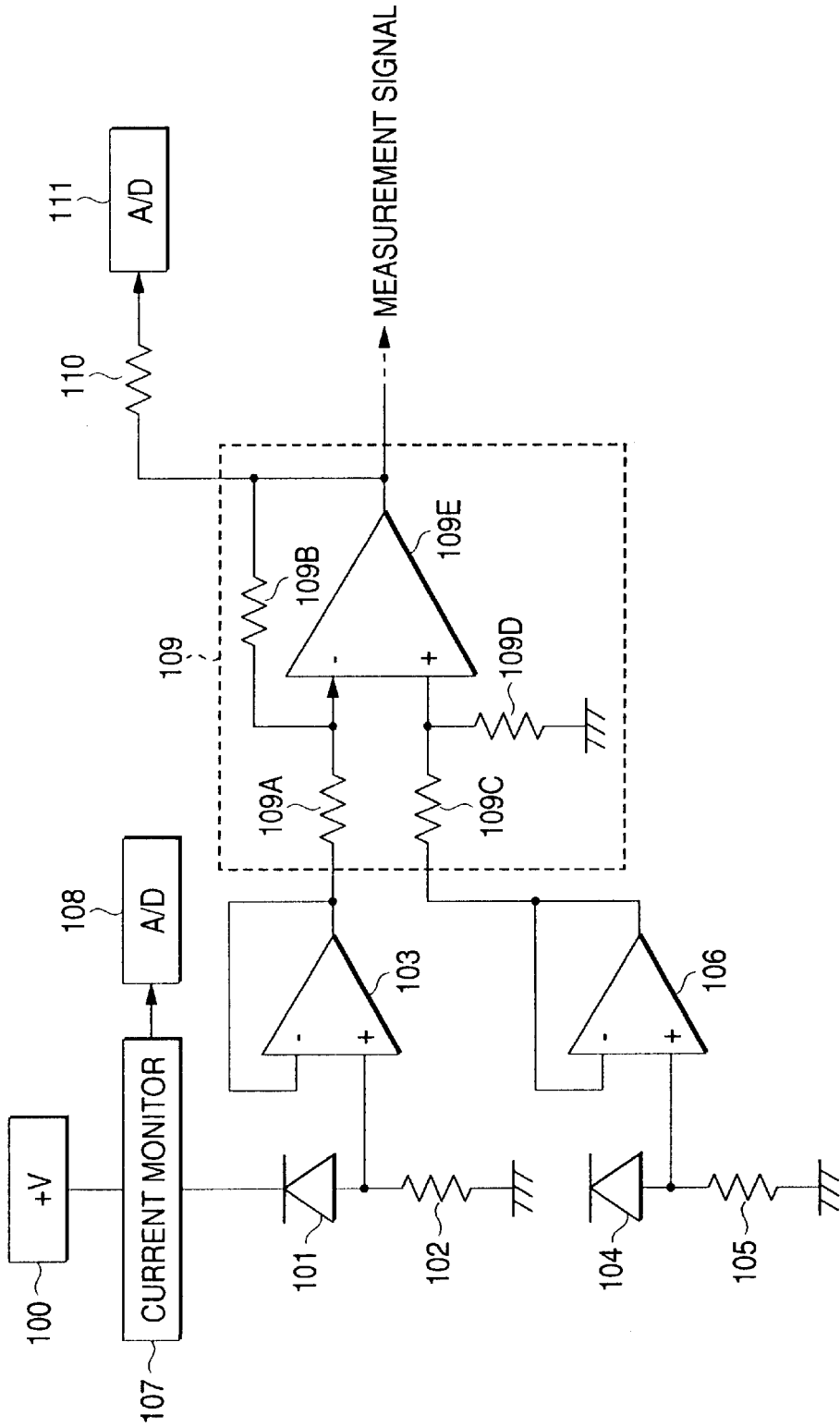
FIG. 3 is a schematic diagram showing the configuration of a conventional light-receiving circuit for use in an EOS oscilloscope.

The optical signal (ie., laser beams) excited from the polarization beam splitters 6 and 8 of the electro-optic probe as shown in FIG. 2 enter the photodiodes 51 and 53 (FIG. 3), respectively.

A current monitor 54 is disposed in a current path extending between the bias power supply 50P and the photodiode 51, and the value of the current monitored by the current monitor 54 is subjected to analog-to-digital conversion by the analog-to-digital converter 55. The thus-converted signal is input to a subtraction circuit 60 and an addition circuit 61. Similarly, a current monitor 57 is disposed in a current path extending between the bias power supply 50N and the photodiode 52, and the value of the current monitored by the current monitor 57 is subjected to analog-to-digital conversion by the analog-to-digital converter 58. The thus-converted signal is input to the subtraction circuit 60 and the addition circuit 61. The value of the current monitored by the current monitor 54 represents a detection value (absolute value) of the current produced by the photodiode 51, and the value of the current monitored by the current monitor 57 represents a detection value of the current produced by the photodiode 52.

The subtraction circuit 60 constitutes a control section (not having any reference numeral) for correcting variations in the characteristics of the photodiodes 51 and 52. In a case where the photodiodes 51 and 52 receive reference light having a predetermined signal intensity, the subtraction circuit 60 controls a ratio between the polarization of the optical signal received by the photodiode 51 and the polarization of the optical signal received by the photodiode 52, such that errors in the values of the currents detected by the current monitors 54 and 57 are reduced.

The addition circuit 61 constitutes a correction section for correcting, for example, the amount of variation in a measurement signal stemming from variations in the laser beam output from the laser diode 9 shown in FIG. 2. The addition circuit 61 corrects the value of a signal output from the amplifier 53 in accordance with the amount of variations in the sum of values of the currents monitored (values detected) by the current monitors 54 and 57.

The bias power supply 50P is connected to the photodiode 51 by way of a coaxial cable 56, and the bias power supply 5ON is connected to the photodiode 52 by way of a coaxial cable 59. Each of the coaxial cables 56 and 59 is shielded at a ground potential, has a given capacitor, and acts as a filter for removing an RF component such as noise. Although not shown in the drawing, a coaxial cable having only shielding capability connects the point of connection P of the photodiodes 51 and 52 to the input section of the amplifier 53. The point of connection P and the input section may be connected together by means of a cable other than the coaxial cable.

The operation of the light-receiving circuit of the embodiment will now be described.

The photodiode 51 of the light-receiving circuit receives the laser beam which is output from the polarization beam splitter 6 shown in FIG. 2 and whose polarization state corresponds to the target signal and produces an electric current corresponding to the intensity of the laser beam. In contrast, the photodiode 52 receives the laser beam which is output from the polarization beam splitter 8 and whose polarization state corresponds to the target signal and produces an electric current corresponding to the intensity of the laser beam.

The electric current produced by the photodiode 51 and the electric current produced by the photodiode 52 appear in the point of connection P, and the difference between these electric currents is input to the amplifier 53. A voltage corresponding to the current of difference is output as a measurement signal. More specifically, the measurement signal is obtained as an electric signal corresponding to a relative relationship between the intensity of the optical signal received by the photodiode 51 and the intensity of the optical signal received by the photodiode 52.

The EOS oscilloscope equipped with the foregoing light-receiving circuit performs various processing operations for reproducing the waveform of the target signal from the measurement signal output from the light-receiving circuit.

If variations exist in the characteristics of the photodiodes 51 and 52, an apparent change arises in the intensity of the optical signals received by the photodiodes 51 and 52. The target signal can be reproduced accurately. The amount of variation in the measurement signal stemming from a difference in characteristics between the photodiodes 51 and 52 is corrected by means of the control section constituted of the subtraction circuit 60.

More specifically, the reference light having known intensity enters the photodiodes 51 and 52, and the difference between the value of the current monitored by the current monitor 54 and the value of the current monitored by the current monitor 57 is determined by the subtraction circuit 60. If no difference exists between the characteristic of the photodiode 51 and the characteristic of the photodiode 52, the values of the currents monitored by the current monitors 54 and 57 should be equal and no difference will be output.

In contrast, if a difference of characteristics exist between the photodiodes 51 and 52, a signal corresponding to the difference is output. The ratio of polarization between the optical signal received by the photodiode 51 and the optical signal received by the photodiode 52 is controlled, such that the difference in value between the current monitored by the current monitor 54 when the photodiode 51 receives the reference light and the current monitored by the current monitor 57 when the photodiode 52 receives the reference light becomes smaller, in consideration of the difference in characteristics between the photodiodes 51 and 52. The control is effected by rotation of, for example, of the quarter-wave plate 5.

If a variation arises in the laser beam output from the laser diode 9, a change arises in the difference between the electric current produced by the photodiode 51 and the electric current produced by the photodiode 52 even when the target signal remains in a constant state. Consequently, the resultant measurement signal is changed. To prevent such a change, the variation in the measurement signal stemming from a variation in the laser beam output from the laser diode 9 is corrected by means of the correction section constituted of the addition circuit 61.

The electric current produced by the photodiode 51 depends on the intensity of the optical signal to be received by the photodiode 51, and the electric current produced by the photodiode 52 depends on the intensity of the optical signal to be received by the photodiode 52. The sum of the intensity of the optical signal received by the photodiode 51 and the intensity of the optical signal received by the photodiode 52 is equal to the intensity of the laser beam A output by the laser diode 9 (where a loss in the intensity of the signal or laser beam caused in individual sections is ignored). Consequently, a variation in the laser beam A output from the laser diode 9 can be determined on the basis of the sum of the electric currents monitored by the current monitors 54 and 57.

The sum of the values of the electric currents monitored by the respective current monitors 54 and 57 is determined, and the addition circuit 61 corrects the measurement signal according to the thus-determined sum. More specifically, the sum of the values of the electric currents monitored by the current monitors 54 and 57 when no variations arise in the laser beam output from the laser diode 9 is taken as a reference, and the measurement signal is increased or decreased by only a proportion corresponding to the amount of variation in the sum of the values of the electric currents monitored by the current monitors 54 and 57. For example, if the sum of the values of the currents monitored by the current monitors 54 and 57 is increased by only 5%, the value of the measurement signal is also decreased by only 5%. As a result, the measurement signal reflects only the target signal, and the waveform of the target signal can be reproduced accurately.

In the previous embodiment, the control section comprising the subtraction circuit 60 controls the difference in the electric currents stemming from a variation in characteristic between the photodiodes 51 and 52. The control section may also control a difference in the electric currents of the photodiodes 51 and 52 stemming from a reason other than the target signal. Further, the correction section comprising the addition circuit 61 corrects a difference in the electric current produced by the photodiode 51 and the electric current produced by the photodiode 52 stemming from a variation in the laser beam output from the laser diode 9. The correction section may also correct a difference between the electric currents of the photodiodes 51 and 52 stemming from a reason other than the target signal.

The balance between the photodiodes 51 and 52 is monitored through use of the subtraction circuit 60. The balance may also be monitored by monitoring the output of the difference amplifier 109 of the conventional technology shown in FIG. 3.

The control section comprising the subtraction circuit 60 and the correction section comprising the addition circuit 61 may also be embodied by a computation circuit such as a CPU.

If variations in the characteristics of the photodiodes 51 and 52 are sufficiently small, the control section comprising the subtraction circuit 60 may be omitted. If variations in the output of the laser diode 9 are sufficiently small, the correction section comprising the addition circuit 61 may be omitted.

As has been described, the present invention yields the following advantageous results.

According to a first aspect of the present invention, first and second optical signals, whose polarization state correspond to the voltage of a target signal, are received, and a current corresponding to the difference between the intensity of the first optical signal and the intensity of the second optical signal is amplified. Even when a sampling rate is increased, in-phase signal components of the first and second optical signals do not appear as an error in a measurement signal. Consequently, the received optical signals can be accurately converted into electric signals. Therefore, an EOS oscilloscope which operates at high speed and has high sensitivity can be embodied.

Preferably, the ratio of polarization between the first and second optical signals is controlled such that the difference between the values of electric currents to be caused when the reference light is received, become smaller. Accordingly, even if a variation arise in the characteristics of, for example, elements for converting the first and second optical signals into electric signals, the variation is prevented from arising in the form of an error in a measurement signal. Thus, the received optical signals can be accurately converted into electric signals.

Preferably, the value of the output from the laser is corrected in accordance with the amount of variation in the sum of electric signals which are produced so as to correspond to the first and second optical signals. Accordingly, even if a variation arises in an output of, for example, a laser for sampling purpose, the variation will not appear in the form of an error in the measurement signal. Consequently, the received optical signals can be accurately converted into electric signals.

What is claimed is:

1. A light receiving circuit for use in electro-optic sampling oscilloscope which receives first and second optical signals resulting from polarized separation of an optical signal whose polarized state reflects the voltage of a signal to be measured, and which produces an electric signal corresponding to the relative relationship between the intensity of the first optical signal and the intensity of the second optical signal, said circuit comprising:

first and second photo-electric conversion elements which are connected in series between a first bias power supply and a second bias power supply, receive the first and second optical signals, and respectively, for converting the first and second optical signals into electric signals;

an amplifier which receives an electric signal appearing in a point of connection between the first and second photo-electric conversion elements for amplifying the electric signal;

a first detector for detecting the electric signal converted by said first photo-electric conversion element wherein the first detector is connected in series between the first bias power supply and the first photo-electric conversion element; and a second detector for detecting the electrical signal converted by said second photo-electric conversion element wherein the second detector is connected in series between the second bias power supply and the second photo-electric conversion element.

2. A light receiving circuit for use in electro-optic sampling oscilloscope which receives first and second optical signals resulting from polarized separation of an optical signal whose polarized state reflects the voltage of a signal to be measured, and which produces an electric signal corresponding to the relative relationship between the intensity of the first optical signal and the intensity of the second optical signal, said circuit comprising:

first and second photo-electric conversion elements which are connected in series between a first bias power supply and a second bias power supply, receive the first and second optical signals, and respectively, for converting the first and second optical signals into electric signals;

an amplifier which receives an electric signal appearing in a point of connection between the first and second photo-electric conversion elements for amplifying the electric signal;

a first detector for detecting the electric signal converted by said first photo-electric conversion element wherein the first detector is connected in series between the first bias power supply and the first photo-electric conversion element;

a second detector for detecting the electrical signal converted by said second photo-electric conversion element wherein the second detector is connected in series between the second bias power supply and the second photo-electric conversion element; and a control section for controlling the ratio of polarization between the optical signals such that the difference between the value detected by said first detector and the value detected by said second detector becomes smaller when said first and second photo-electric conversion elements receive the reference light.

3. A light receiving circuit for use in electro-optic sampling oscilloscope which receives first and second optical signals resulting from polarized separation of an optical signal whose polarized state reflects the voltage of a signal to be measured, and which produces an electric signal corresponding to the relative relationship between the intensity of the first optical signal and the intensity of the second optical signal, said circuit comprising:

first and second photo-electric conversion elements which are connected in series between a first bias power supply and a second bias power supply, receive the first and second optical signals, and respectively, for converting the first and second optical signals into electric signals;

an amplifier which receives an electric signal appearing in a point of connection between the first and second photo-electric conversion elements for amplifying the electric signal;

a first detector for detecting the electric signal converted by said first photo-electric conversion element wherein the first detector is connected in series between the first bias power supply and the first photo-electric conversion element;

a second detector for detecting the electrical signal converted by said second photo-electric conversion element wherein the second detector is connected in series between the second bias power supply and the second photo-electric conversion element; and a correction section for correcting the value of an output of said amplifier according to the amount of variation in the sum of the value detected by said first detector and the value detected by said second detector.

* * * * *